United States Patent
Hadizad et al.

[11] Patent Number: 5,804,869
[45] Date of Patent: Sep. 8, 1998

[54] CLAMP DISPOSED AT EDGE OF A DIELECTRIC STRUCTURE IN A SEMICONDUCTOR DEVICE AND METHOD OF FORMING SAME

[75] Inventors: Peyman Hadizad, Scottsdale; Ali Salih, Tempe; John Robert Bender; John David Moran, both of Mesa, all of Ariz.

[73] Assignee: Motorola, Inc., Schaumburg, Ill.

[21] Appl. No.: 829,073

[22] Filed: Mar. 31, 1997

[51] Int. Cl.$^6$ .................................................. H01L 23/58
[52] U.S. Cl. ........................... 257/632; 257/635; 257/744
[58] Field of Search .................................. 257/744, 472, 257/476, 483, 484, 700, 632, 635, 636

[56] References Cited

U.S. PATENT DOCUMENTS

| 3,763,408 | 10/1973 | Kano et al. | 257/483 |
| 5,621,227 | 4/1997 | Joshi | 257/200 |

FOREIGN PATENT DOCUMENTS

| 61-102071 | 5/1986 | Japan | 257/744 |

OTHER PUBLICATIONS

"Semiconductor Power Devices, Physics of Operation and Fabrication Technology"; Sorab K. Ghandhi; John Wiley & Sons, Inc.; 1977; pp. 70–72.

*Primary Examiner*—Mahshid D. Saadat
*Assistant Examiner*—S. V. Clark
*Attorney, Agent, or Firm*—Rennie William Dover

[57] ABSTRACT

A semiconductor structure (10) uses a clamp (16) disposed at an edge (27) of a dielectric structure (14) in a semiconductor device. The clamp substantially reduces the separation or peeling of the dielectric structure or layer away from the underlying semiconductor material (20,24). The clamp also provides the benefit of protecting the interface between the dielectric layer and the underlying semiconductor material from chemical or moisture attack, either during later processing or after final manufacture. Such chemical or moisture attack and internal film stress are factors leading to separation of the dielectric film from the underlying semiconductor material. The clamp is useful, for example, in preventing separation of silicon nitride or oxide passivation from gallium arsenide substrates in power rectifier diodes.

24 Claims, 1 Drawing Sheet

5,804,869

CLAMP DISPOSED AT EDGE OF A DIELECTRIC STRUCTURE IN A SEMICONDUCTOR DEVICE AND METHOD OF FORMING SAME

BACKGROUND OF THE INVENTION

The present invention relates, in general, to semiconductor devices and, more particularly, to structures positioned at the edge of a semiconductor device that provide greater resistance against peeling or poor adhesion of a dielectric overlying a semiconductor substrate.

Silicon nitride is commonly used for passivation in current gallium arsenide (GaAs) semiconductor devices. However, one of the problems associated with silicon nitride is that of separation from the underlying semiconductor substrate due to its high internal film stress. Another factor contributing to this separation or peeling problem is that the silicon nitride layer must be formed as a deposited layer (e.g. by chemical vapor deposition) rather than being grown by chemical reaction (such as an oxide that is grown in a silicon semiconductor device). Poor adhesion of the deposited silicon nitride layer to GaAs leads to this separation problem.

One particular type of device in which silicon nitride is used as passivation is a power rectifier diode. Such a diode typically has a metal anode in contact with a GaAs epitaxial layer on a GaAs substrate. The anode is surrounded by a silicon nitride passivation layer, which has been deposited to be in contact with the GaAs epitaxial layer. However, in a power device such as a rectifier diode, it is necessary that the passivation layer have a greater thickness than would be needed for a device in a lower voltage application. As a result of this greater thickness, the film stress of the silicon nitride acts to a greater detrimental extent, and when combined with the relatively poor adhesion of silicon nitride to GaAs, the problem of peeling of the silicon nitride away from the GaAs is exacerbated. This peeling leads to greater instability in the rectifier's electrical characteristics and sometimes to complete rectifier failure.

Accordingly, there is a need for an improved passivation structure and method that will reduce or eliminate the problem of peeling of passivation or other dielectric layers away from a supporting semiconductor substrate.

DETAILED DESCRIPTION OF THE DRAWINGS

Briefly stated, the present invention provides a semiconductor structure that uses a clamp located at an edge of a dielectric structure overlying a semiconductor device. The clamp substantially reduces the separation or peeling of the dielectric structure or layer away from the underlying semiconductor substrate.

The clamp according to the present invention is of significant advantage in compound semiconductor devices using nitride or oxide passivation layers. In these particular cases, even where a relatively thick nitride or oxide passivation layer such as silicon nitride or silicon oxide is deposited onto a compound semiconductor substrate such as gallium arsenide, the clamp of the present invention, when disposed around the edge or perimeter of the nitride or oxide, substantially eliminates the prior problem of peeling of the nitride or oxide layer.

The clamp also provides the benefit of protecting the interface between the dielectric layer and the underlying semiconductor material from chemical or moisture attack, either during later processing to form the device or after final manufacture. Without this protection of the interface by the clamp, the chemicals or moisture would further aggravate the peeling problem.

Figure 1:
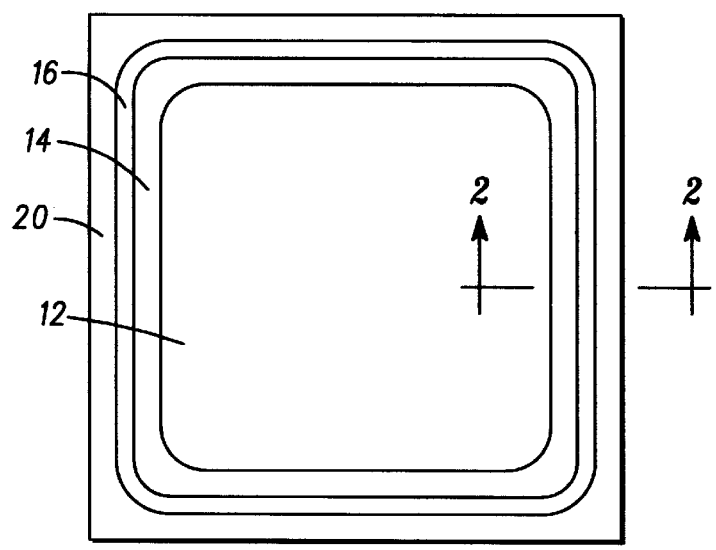
FIG. 1 is a top plan view of a semiconductor structure with a clamp according to the present invention.
Figure 2:
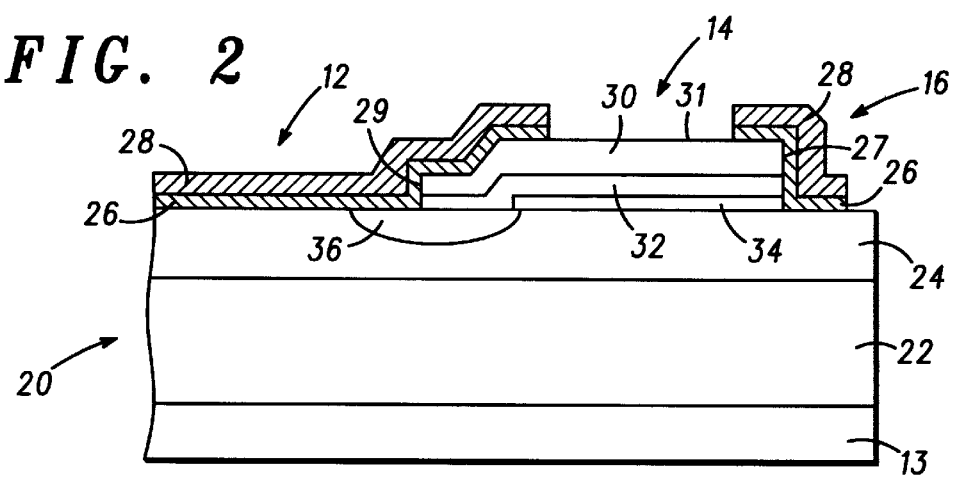
FIG. 2 is an enlarged cross-sectional view of a portion of the semiconductor structure of FIG. 1.
Figure 3:
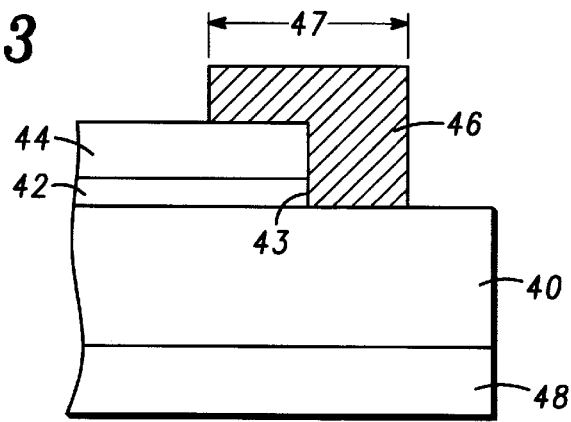
FIG. 3 is an even more highly-enlarged cross-sectional view of a clamp according to another embodiment of the present invention.

The present invention can be more fully described for the particular embodiment of a power rectifier diode with reference to FIGS. 1–3. However, although a diode is described below, it should be appreciated that the clamp of the present invention will have broad applicability to the clamping or sealing at the edge of dielectric and passivation layers in many types of other devices including transistors and thyristors and GaAs microwave and optical devices. Further, although the diode below is a compound semiconductor device, the clamp can also be used with silicon devices. Moreover, although a power device is illustrated, the clamp is useful for devices operating in any conventional voltage range.

FIG. 1 is a top plan view of a semiconductor structure or rectifier 10 having a clamp or seal 16 according to the present invention. An electrode 12, which acts as an anode in the case of a rectifier device, is disposed in contact with a semiconductor material 20 of, for example, GaAs or another compound semiconductor. Electrode 12 is disposed on a portion of a dielectric or passivation structure 14 that fully surrounds electrode 12. Clamp 16 fully surrounds the outside perimeter of dielectric structure 14.

FIG. 2 is an enlarged cross-sectional view of a portion of the semiconductor structure of FIG. 1 that further illustrates the structure of clamp 16. Prior reference numbers are used for common elements. Although only a portion near the edge of rectifier 10 is shown in FIG. 2, rectifier 10 otherwise has a conventional structure.

Electrode 12 is disposed on semiconductor material 20, which is comprised of an epitaxial layer 24 formed on a substrate 22, each for example formed of GaAs. For rectifier 10, substrate 22 is, for example, heavily-doped to have an N+ type doping, and epitaxial layer 24 is lightly-doped to have an N– type doping. It should be noted that in other embodiments of the present invention, instead of a Schottky junction as used above, epitaxial layer 24 could be doped with a P type dopant across its surface to provide a PN junction. Also, in other devices epitaxial layer 24 may not even be needed depending on the particular type of device being formed. Also, the conductivity type of the doping could be changed appropriately in the device to provide a P– epitaxial layer on a P+ substrate as an alternative to the above.

Electrode 12 itself is comprised of two layers in this embodiment. The first layer is a conductive barrier layer 26 of, for example, titanium, and the second layer is a conductive top layer 28 of, for example, aluminum. Electrode 12 is disposed over an edge 29 of dielectric structure 14. A conventional guard ring 36 is doped to have a P type doping, and a portion of dielectric structure 14 is positioned directly overlying guard ring 36. Both epitaxial layer 24 and guard ring 36 are formed using conventional methods.

As mentioned above, electrode 12 acts as an anode in this particular embodiment of a power rectifier diode. Also, an electrode 13 on the back-side of substrate 22 acts as a cathode for this diode. Electrode 13 can be formed using a conventional back metal approach.

Dielectric structure 14 is comprised of three layers in this rectifier diode embodiment: a bottom dielectric layer 34, a middle dielectric layer 32, and a top dielectric layer 30. Bottom layer 34 is provided for initial pattern registration (having a thickness of, for example, about 1,000 angstroms), middle layer 32 (having a thickness of, for example, about 1,000 angstroms) acts as a guard ring anneal cap, and top layer 30 (having a thickness of, for example, about 3,000–8,000 angstroms for 180–250 volt diodes) is provided for achieving high breakdown voltage. Here, for example, these three layers have been formed by successive plasma-enhanced chemical vapor deposition (PECVD) and patterning of silicon nitride. However, in other embodiments, dielectric structure 14 may be formed of one, two, or even more than three layers depending on the application.

Also, other materials can be used to form dielectric structure 14 such as silicon oxide (e.g. formed by PECVD), aluminum nitride, gallium nitride, phosphosilicate glass (PSG), or polyimide. It should be appreciated that although the illustrated embodiment here uses silicon nitride, the other materials mentioned above such as silicon oxide also will benefit from the use of clamp 16 according to the present invention.

Clamp 16 is disposed at edge 27 of dielectric structure 14, and a portion of clamp 16 and electrode 12 is disposed on a top surface 31. Also, clamp 16 is in contact with the side of dielectric structure 14 and a portion of epitaxial layer 24.

"Clamp" as used in this application generally refers to a structure that has good adhesion to both dielectric structure 14 and semiconductor material 20, which here is epitaxial layer 24, and that assists in reducing physical lifting or peeling of dielectric structure 14 in the vicinity of edge 27. It is necessary that the material selected for forming clamp 16 have such good adhesion, and it is believed that this good adhesion permits clamp 16 to substantially prevent lifting of any of the layers of dielectric structure 14 due to tensile or compressive stress in any of these layers, or due to poor adhesion to the underlying semiconductor material.

Clamp 16 has been found to be of particular benefit when the combined thickness of dielectric structure 14 is greater than about 1,000 angstroms, for example, when using silicon nitride or silicon oxide layers. Also, clamp 16 is of particular benefit in situations where one or more dielectric layers will have either a tensile or compressive film stress with a magnitude greater than about 2E9 dynes per square centimeter (dyn/cm$^2$). Clamp 16 is especially of benefit when both of these conditions regarding thickness and stress are present in the dielectric structure.

An advantage of clamp 16 is that it substantially seals the complete interface between dielectric layer 14 and epitaxial layer 24 against adverse chemical or mechanical action by chemicals, water, moisture, or other agents used in later processing steps or after manufacture. Although not shown in FIG. 2 for ease of illustration, during the formation of rectifier 10, an undesirable interfacial oxide will form on all or a significant portion of the gallium arsenide at the interface between epitaxial layer 24 and bottom dielectric layer 34 (this interfacial oxide is further illustrated in FIG. 3 below) due to inadvertent or unavoidable exposure to an oxygen-containing ambient. This interfacial oxide is comprised of arsenic and gallium oxides of various stoichiometries possibly including $Ga_2O_3$, $As_2O_3$, $GaAsO_4$, and $GaAsO_2$. Arsenic oxides are very unstable and are believed to be readily disintegrated or dissolved upon exposure to moisture, water, and other wet etchants used in later processing steps.

Prior devices not using such a clamp are susceptible to adverse chemical attack at this interfacial oxide, which is believed to lead more readily to the peeling seen in these prior devices. In order to best seal this interface, it is preferable that clamp 16 extend continuously around the full perimeter of dielectric structure 14 at edge 27 (the full sealing of the perimeter of semiconductor structure 10 is shown in FIG. 1) so that the full extent of the interface is sealed.

Clamp 16 is comprised, in this particular embodiment, of a physically-separated portion of conductive layers 26 and 28. These two layers have been conveniently formed from a common two-layer stack initially, for example, sputtered over the top surface of epitaxial layer 24 and dielectric structure 14. After sputtering, these two layers are patterned to provide clamp 16 and electrode 12. An advantage of this approach is that a single layout mask and pattern step can be used to form both elements. Another advantage of first sputtering conductive barrier layer 26 using a titanium material is that titanium adhesion to gallium arsenide is very strong.

In other embodiments, clamp 16 could be formed of other materials and also formed using a separate layout mask. For example, clamp 16 could be formed from another metal (e.g. a gold-germanium alloy), a polyimide, an oxide, a nitride, or polysilicon. One property that the material used to form clamp 16 preferably has is a different etch selectivity to the chemical used to pattern the clamp than for the material used to form dielectric structure 14. Also, the material preferably provides a good conformal layer for forming clamp 16.

Semiconductor structure 10 above can be formed using conventional processing steps modified as necessary to provide the structure of clamp 16 as discussed above. Epitaxial layer 24 is conventionally formed on substrate 22. Dielectric layer 34 and guard ring 36 are next conventionally formed. Dielectric layers 32 and 30 are formed in succession by, for example, conventional PECVD and photomask patterning as mentioned above. Next, electrode 12 and clamp 16 are formed, for example, in a single sputter and photomask pattern sequence. Subsequent processing steps are conventional.

FIG. 3 is an even more highly-enlarged cross-sectional view of a clamp 46 in a rectifier diode according to another embodiment of the present invention. A clamp 46 in this embodiment has been formed of a single layer of material and has a slightly different shape than clamp 16 of FIG. 2. Clamp 46 is disposed at an edge of a dielectric layer 44, which has been formed overlying a substrate 40, such as for example a gallium arsenide substrate. A conventional electrode 48, for example a cathode, is on the back-side of substrate 40.

As discussed above, an interfacial oxide 42 inadvertently forms between dielectric layer 44 and substrate 40. Interfacial oxide 42 is believed to have a thickness of about 10–50 angstroms and may even be broken into isolated regions across the top surface of substrate 40, rather than being a continuous layer. As seen in FIG. 3, clamp 46 provides a seal over the edge 43 of interfacial oxide 42 that prevents chemical, moisture, or water intrusion from the other side of clamp 46. Thus, clamp 46 prevents undesired degradation of interfacial oxide 42 that would otherwise degrade the adhesion of dielectric layer 44 to substrate 40.

For this particular rectifier diode and rectifier 10 above, clamp 46 has a total width indicated by arrow 47 that is equal to or less than about 25 microns, and the thickness of clamp 46 (or clamp 16 above) is typically less than about 12 microns. However, these dimensions will vary depending on the particular material used to form the clamp and its shape. Also, electrode 12 and clamp 16 are physically separated across top surface 31 (see FIG. 2) by a lateral distance of greater than about 37 microns.

Another benefit of the use of clamp 16 when formed of a conductive material is that the clamp acts as a ground plane and stabilizes any ionic charge on the top surface of the dielectric structure. Also, the clamp substantially eliminates migration of contamination or ionic charge to the device junction at the surface of the epitaxial layer.

By now, it should be appreciated that there has been provided a novel clamp and method of forming at an edge of a dielectric structure in a semiconductor device. The clamp substantially prevents peeling of the dielectric structure and degradation of the device's electrical characteristics or reliability.

The foregoing discussion discloses and describes merely exemplary methods and embodiments of the present invention. As will be understood by those familiar with the art, the invention may be embodied in other specific forms without departing from the spirit or essential characteristics thereof. Accordingly, the disclosure of the present invention is intended to be illustrative, but not limiting, of the scope of the invention, which is set forth in the following claims.

What is claimed is:

1. A semiconductor structure having a clamp for substantially preventing separation of a dielectric structure from a compound semiconductor material, comprising:

said compound semiconductor material;

said dielectric structure disposed overlying said compound semiconductor material wherein said dielectric structure has an edge; and said clamp disposed on said dielectric structure at said edge wherein said clamp is disposed in contact with both a portion of said dielectric structure and a portion of said compound semiconductor material proximate to said edge, and wherein said clamp is formed from a material selected from the group consisting of a polyimide, an oxide, a nitride, and polysilicon.

2. The semiconductor structure of claim 1 further comprising an interfacial oxide disposed at least in part between said dielectric structure and said compound semiconductor material.

3. The semiconductor structure of claim 2 wherein said interfacial oxide includes at least one material selected from the group consisting of gallium oxide and arsenic oxide.

4. The semiconductor structure of claim 1 wherein said dielectric structure comprises a nitride layer.

5. The semiconductor structure of claim 1 wherein said dielectric structure comprises a dielectric layer having a stress greater than about 2E9 dynes per square centimeter.

6. The semiconductor structure of claim 5 wherein said dielectric structure has a thickness greater than about 1,000 angstroms.

7. The semiconductor structure of claim 1 wherein said dielectric structure comprises at least one layer selected from the group consisting of silicon nitride, aluminum nitride, gallium nitride, phosphosilicate glass, and polyimide.

8. The semiconductor structure of claim 1 wherein said clamp has a thickness of less than about 12 microns.

9. The semiconductor structure of claim 1 wherein said clamp has a total width less than about 25 microns.

10. The semiconductor structure of claim 1 wherein said clamp substantially seals a full outside perimeter of said dielectric structure corresponding to said edge against chemical attack at an interface between said dielectric structure and said compound semiconductor material.

11. The semiconductor structure of claim 1 wherein said compound semiconductor material is gallium arsenide.

12. The semiconductor structure of claim 1 wherein said dielectric structure comprises two or more layers of nitride.

13. The semiconductor structure of claim 1 wherein said clamp is disposed on a portion of a top surface of said dielectric structure.

14. A semiconductor structure comprising:

a compound semiconductor material;

a dielectric structure disposed overlying said compound semiconductor material wherein said dielectric structure has a first edge and a second edge and said dielectric structure comprises a dielectric layer having a stress greater than about 2E9 dynes per square centimeter;

a conductive layer disposed on a first portion of said dielectric structure at said first edge of said dielectric structure wherein said conductive layer is in contact with said compound semiconductor material; and a clamp disposed on a second portion of said dielectric structure at said second edge of said dielectric structure wherein said conductive layer and said clamp are physically separated.

15. The semiconductor structure of claim 14 wherein said conductive layer and said clamp are physically separated by a distance of greater than about 37 microns.

16. A semiconductor structure comprising:

a semiconductor material;

a dielectric structure disposed overlying said semiconductor material wherein said dielectric structure has an edge and comprises a dielectric layer having a stress greater than about 2E9 dynes per square centimeter; and a clamp disposed at said edge of said dielectric structure.

17. A rectifier diode comprising:

a compound semiconductor material;

a dielectric structure disposed overlying said compound semiconductor material wherein said dielectric structure has a first edge and a second edge and an outside perimeter corresponding to said second edge;

an electrode disposed on a first portion of said dielectric structure at said first edge of said dielectric structure wherein said electrode is in contact with said compound semiconductor material; and a clamp disposed on a second portion of said dielectric structure at said second edge of said dielectric structure wherein said electrode and said clamp are physically separated and wherein said clamp seals said second edge of said dielectric structure substantially continuously and fully around said outside perimeter.

18. The rectifier diode of claim 17 wherein said compound semiconductor material comprises an epitaxial layer disposed on a more heavily doped compound semiconductor substrate.

19. The rectifier diode of claim 18 wherein said epitaxial layer comprises a guard ring disposed directly underneath a portion of said dielectric structure.

20. The rectifier diode of claim 17 wherein said dielectric structure is formed from a nitride and said electrode is a metal layer.

21. The rectifier diode of claim 20 wherein said metal layer comprises a layer of aluminum on a layer of titanium.

22. A method of forming a semiconductor structure having a clamp for substantially preventing separation of a dielectric structure, comprising the steps of:

providing a compound semiconductor material;

disposing said dielectric structure overlying said compound semiconductor material wherein said dielectric structure has a first edge; and forming said clamp on said dielectric structure at said first edge wherein said clamp is disposed in contact with both a first portion of said dielectric structure and a portion of said compound semiconductor material proximate to said first edge, and wherein said step of forming said clamp includes selecting a material for said clamp from the group consisting of a polyimide, an oxide, a nitride, and polysilicon.

23. The method of claim 22 further comprising the step of forming an electrode overlying said compound semiconductor material, wherein said electrode is disposed at a second edge of said dielectric structure in contact with a second portion of said dielectric structure.

24. The method of claim 23 wherein said electrode and said clamp are formed at least in part from a common conductive layer.

* * * * *